(12) United States Patent
Zhu (10) Patent No.: US 11,747,523 B1
(45) Date of Patent: Sep. 5, 2023

(54) DYNAMIC DOT ARRAY ILLUMINATORS

(71) Applicant: Meta Platforms Technologies, LLC, Menlo Park, CA (US)

(72) Inventor: Zhaoming Zhu, Redmond, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/370,749

(22) Filed: Jul. 8, 2021

Related U.S. Application Data (63) Continuation of application No. 16/440,929, filed on Jun. 13, 2019, now Pat. No. 11,092,719.

(60) Provisional application No. 62/798,333, filed on Jan. 29, 2019.

(51) Int. Cl.
| | |
|---|---|
| *G02B 3/00* | (2006.01) |
| *G02B 27/01* | (2006.01) |
| *H04N 13/271* | (2018.01) |
| *H01S 5/42* | (2006.01) |
| *H01S 5/183* | (2006.01) |

(52) U.S. Cl.
CPC ....... *G02B 3/0037* (2013.01); *G02B 27/0172* (2013.01); *H04N 13/271* (2018.05); *H01S 5/183* (2013.01); *H01S 5/423* (2013.01)

(58) Field of Classification Search
None
See application file for complete search history.

(56) References Cited

U.S. PATENT DOCUMENTS

| | | |
|---|---|---|
| 9,946,089 B2 | 4/2018 | Chen et al. |
| 2002/0135825 A1 | 9/2002 | Lee et al. |
| 2011/0085213 A1* | 4/2011 | Kim ............. H04N 1/4076 358/475 |
| 2013/0286053 A1 | 10/2013 | Fleck et al. |
| 2015/0355470 A1 | 12/2015 | Herschbach |
| 2017/0070726 A1 | 3/2017 | Goldentouch et al. |
| 2017/0195653 A1* | 7/2017 | Trail ............. H04N 13/366 |
| 2018/0063390 A1* | 3/2018 | Trail ............. G06T 7/50 |
| 2018/0246324 A1* | 8/2018 | Hada ............. G02B 27/0101 |
| 2018/0267214 A1 | 9/2018 | Rossi et al. |
| 2019/0202123 A1* | 7/2019 | Batoni ............ B29C 64/286 |
| 2021/0215798 A1* | 7/2021 | Pandit ............ G01S 17/89 |

* cited by examiner

*Primary Examiner* — William Boddie
*Assistant Examiner* — Bipin Gyawali
(74) *Attorney, Agent, or Firm* — Fenwick & West LLP (57) ABSTRACT

A dot array illuminator includes an illumination source that includes one or more source arrays and a microlens array (MLA). A source array is an array of light emitting components. The source arrays are positioned on a substrate according to a geometric configuration. The MLA includes lens arrays that are arranged in a similar geometric configuration. The microlens array are separated from the source arrays by a distance and are substantially parallel to the source arrays. The microlens array overlaps with the source arrays and is of a dimension such that it can receive substantially all light emitted by the illumination source. The illumination source emits light towards the MLA. The MLA receives the light and outputs structured pattern light by interpolating received light.

20 Claims, 8 Drawing Sheets

DYNAMIC DOT ARRAY ILLUMINATORS

CROSS-REFERENCE TO RELATED APPLICATION

This application is a continuation of co-pending U.S. application Ser. No. 16/440,929, filed Jun. 13, 2019, which claims the benefit of U.S. Provisional Application Ser. No. 62/798,333 filed on Jan. 29, 2019, which is hereby incorporated by reference in its entirety.

BACKGROUND

The present disclosure generally relates to depth sensing, and specifically relates to dot array illuminators that generate array patterns in three-dimensional (3D) depth sensing.

Depth sensors play an important role in artificial reality applications. 3D depth sensing systems typically use near-infrared (NIR) projectors and structured light scanners, light emitting diodes (LEDs) or laser diodes and time of flight (ToF) cameras, or a minimum of two cameras in assisted/active stereo vision (ASV) applications. These 3D depth sensing systems are sensitive to multi-sensor interference. It is challenging to integrate them in size, weight, and power (SWaP) critical platforms such as mobile devices.

SUMMARY

Described herein are dot array illuminators that project structured light in SWaP critical devices. A dot array illuminator includes an illumination source that includes one or more source arrays and a microlens array (MLA). A source array is an array of light emitting components. The source arrays are positioned on a substrate according to a geometric configuration. The MLA includes lens arrays that are arranged in a similar geometric configuration. The microlens array are separated from the source arrays by a distance and are substantially parallel to the source array. The microlens array overlaps with the source array and is of a dimension such that it can receive substantially all light emitted by the illumination source. The illumination source emits light towards the MLA. The MLA receives the light and outputs structured pattern light by interpolating received light.

The dot array illuminator can dynamically adjust the patterns of the structured light. For example, the source arrays can be controlled to emit light concurrently or separately. The source arrays may also emit light having different wavelengths. As another example, the optical power of the microlenses arrays can be adjusted. This adjustable configuration, in combination with appropriate depth-sensing algorithms, improves the performance of a depth sensing system while also conserving power to a system in which the projector device is implemented. Various embodiments described herein can be used for stereo vision when projected onto otherwise textureless surfaces. The dot array illuminators may also be implemented to perform time of flight (ToF) 3D sensing given that the source arrays may be driven at high speeds on the scale of GHz or at sub-nanosecond pulses while maintaining high spatial concentration of optical power to save illuminator power or increase depth sensing range.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Various embodiments may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely-generated content or generated content combined with captured (e.g., real-world) content. The artificial reality content may include video, audio, haptic feedback, or some combination thereof, and any of which may be presented in a single channel or in multiple channels (such as stereo videos that produce a three-dimensional effect to the viewer). Additionally, in some embodiments, artificial reality may also be associated with applications, products, accessories, services, or some combination thereof, that are used to create artificial reality content and/or are otherwise used in (e.g., performing activities in) providing artificial reality experience. The artificial reality system that provides the artificial reality content may be implemented on various platforms, including a headset such as a head-mounted display (HMD) or near-eye display (NED) connected to a host computer system, a standalone HMD, a standalone NED, a mobile device or computing system, or any other hardware platform capable of providing artificial reality content to one or more viewers.

Figure 1:
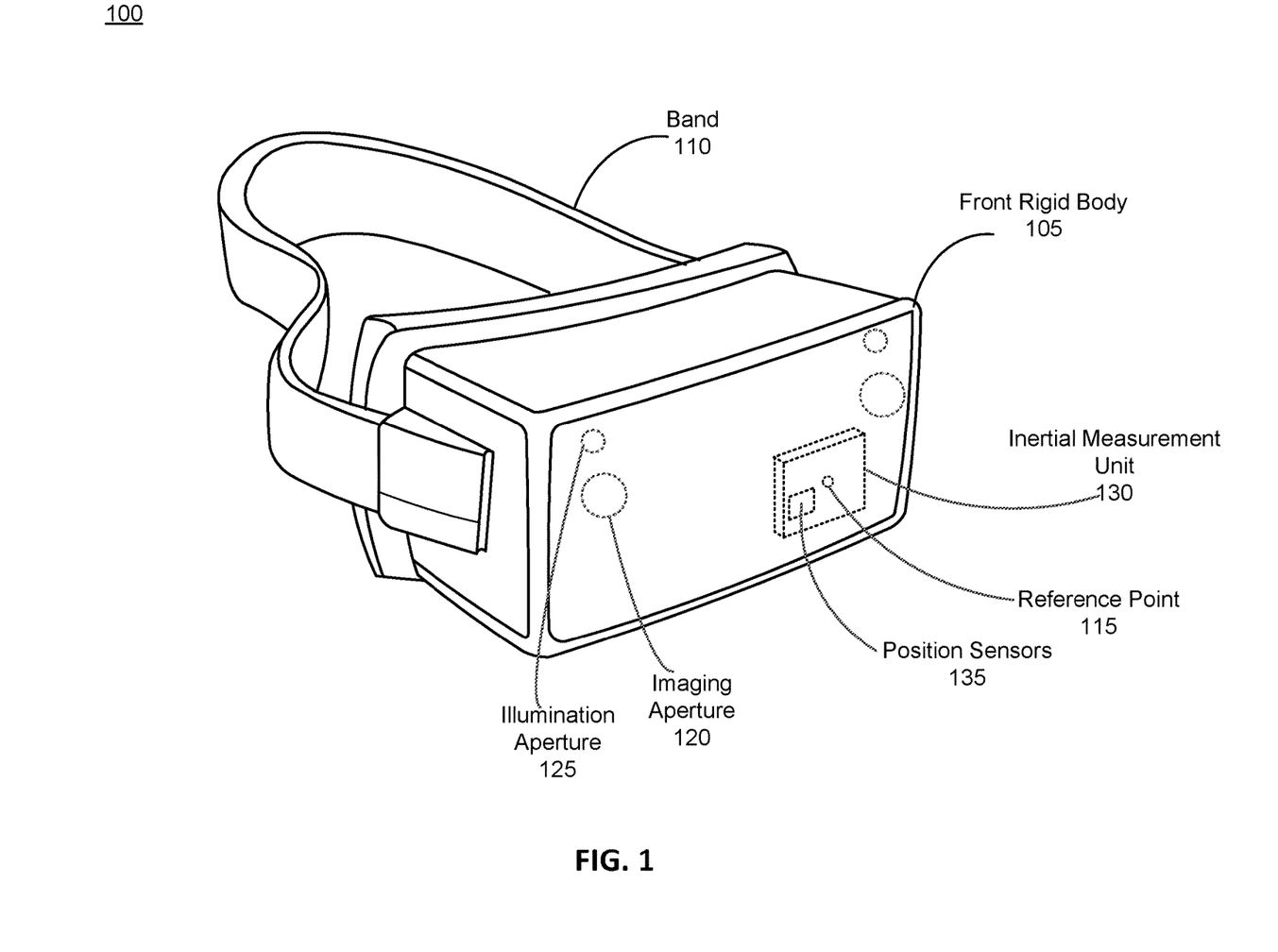
FIG. 1 is a diagram of a headset, according to one embodiment.

FIG. 1 is a diagram of a headset 100, according to an embodiment. In the illustrated embodiment, the headset 100 is a head-mounted display (HMD). In other embodiments, the headset 100 may be a near-eye display (NED) or some other display that is coupled to a head of the user. The headset 100 may be part of, e.g., a VR system, an AR system, a MR system, or some combination thereof. In embodiments that describe an AR system and/or a MR system, portions of a front side 102 of the headset 100 are at least partially transparent in the visible band (~380 nm to 750 nm), and portions of the headset 100 that are between the front side 102 of the headset 100 and an eye of the user are at least partially transparent (e.g., a partially transparent electronic display). The headset 100 presents content to a user. The content can be in the format of images (e.g., image light), video (e.g., image light), audio, or some combination thereof. In some embodiments, audio is presented via an external device (e.g., a speaker, a headphone, a console) that receives audio information from the headset 100 and outputs sound waves.

The headset 100 includes a front rigid body 105, a band 110, and a reference point 115. The headset 100 also includes a depth camera assembly (DCA) (not shown). The DCA determines depth information for objects in a local area around the headset 100. The DCA may determine the depth information according to a variety of principles such as time of flight, structured light depth sensing, stereo depth sensing, and active stereo depth sensing. For example, the DCA measures a time difference between light emitted towards an object and light reflected from the object thereby to determine the object's distance from the DCA. The emitted light can include a light pulse such that the time of flight is measured directly. The emitted light can also include a continuous modulated sinusoidal light wave and the time of flight can be measured indirectly by measuring the phase difference. As another example, the DCA includes a projector that projects structured light of various patterns onto an object, which produces an illumination on the object that appears distorted from other perspectives than that of the projector. The DCA captures the illumination reflected from the object from different perspectives to reconstruct the three-dimensional (3D) shape of the object. As a further example, the DCA captures images of an object from two vantage points and determines depth information by examining the relative positions of the object in the images. The relative depth information can be obtained in the form of a disparity map which encodes the difference in horizontal coordinates of corresponding image points. The values in this disparity map are inversely proportional to the scene depth at the corresponding pixel location. The DCA may use a light source such as a laser or a structured light source to determine projector-camera correspondences and/or camera-camera correspondences.

As further described below, the DCA includes a dot array illuminator and an imaging device. As illustrated, the headset 100 includes an imaging aperture 120 and an illumination aperture 125. The dot array illuminator of the DCA emits light through the illumination aperture 125. The dot array illuminator emits structured light such as dot patterned light and is further described below in more detail in connection with FIGS. 2-6. The imaging device of the DCA captures light from the illumination source that is reflected/scattered from the local area through the imaging aperture 120. Additional imaging apertures 120 associated with other imaging devices and illumination apertures 125 can be positioned at other locations on the headset 100. For example, the illustrated embodiment includes a second imaging aperture 120 associated with a second imaging device positioned on the opposite side of the headset 100.

The front rigid body 105 includes one or more electronic display elements (not shown in FIG. 1) for presenting visual content, one or more tracking systems (not shown in FIG. 1), and an Inertial Measurement Unit (IMU) 130. A tracking system tracks a position and/or movement of a user's eye. The tracking system may also track the user's facial expression, for example, in a region of the user's face surrounding the user's eye. For example, a person's facial expression near brow, nose, and cheek area can be tracked. The tracking system may include a dot array illuminator and a camera. The camera or other optical sensor captures information of the user's eye(s) and/or regions of the user's face. The tracking system uses the captured information to determine eye tracking information and/or face tracking information.

Eye tracking information includes information associated with a position and/or movement of a user's eye. For example, the eye tracking information includes an interpupillary distance, an interocular distance, a three-dimensional (3D) position of each eye relative to the headset 100 for distortion adjustment purposes, including a magnitude of torsion and rotation, and gaze directions for each eye. The tracking system tracks different types of eye movements including, but not restricted to, a saccadic eye movement (e.g. rapid and conjugate movements), a pursuit movement (e.g. a slow-tracking), a compensatory eye movement (e.g. smooth movements compensating for active or passion motions), a vergence eye movement (e.g. two eye moving in opposite directions), a miniature eye movement (e.g. a steady and fixed view of a target), an optokinetic nystagmus (e.g. a sawtooth pattern), or some combination thereof.

Face tracking information includes information associated with one or more motions and/or positions of muscles in the region of the user's face that surrounds the user's eye. For example, the face tracking information includes a position of a brow, a degree of eye opening, a length of a wrinkle, a 3D position of a brow relative to the headset 100 for distortion adjustment purposes, including a magnitude of torsion and rotation. The tracking system tracks different types of facial motion including, but not restricted to, inner brow raising and/or lowering, inner brow shifting, outer brow raising and/or lowering, outer brow shifting, lid raising and/or lowering, cheek raising and/or lowering, nose wrinkling, and the like.

The IMU 130 measures one or more of force, angular rate, and magnetic field surrounding the headset 100. The IMU 130 includes the reference point 115 and one or more position sensors 135. The one or more position sensors measure motion and/or magnetic field at a particular location, for example, the location of the reference point 115. Examples of position sensors 135 include: one or more accelerometers, one or more gyroscopes, one or more magnetometers, another suitable type of sensor that detects motion, a type of sensor used for error correction of the IMU 130, or some combination thereof. The position sensors 135 may be located external to the IMU 130, internal to the IMU 130 as illustrated, or some combination thereof. In illustrated embodiment, neither the IMU 130 nor the position sensors 135 are visible to a user of the headset 100.

Figure 2:
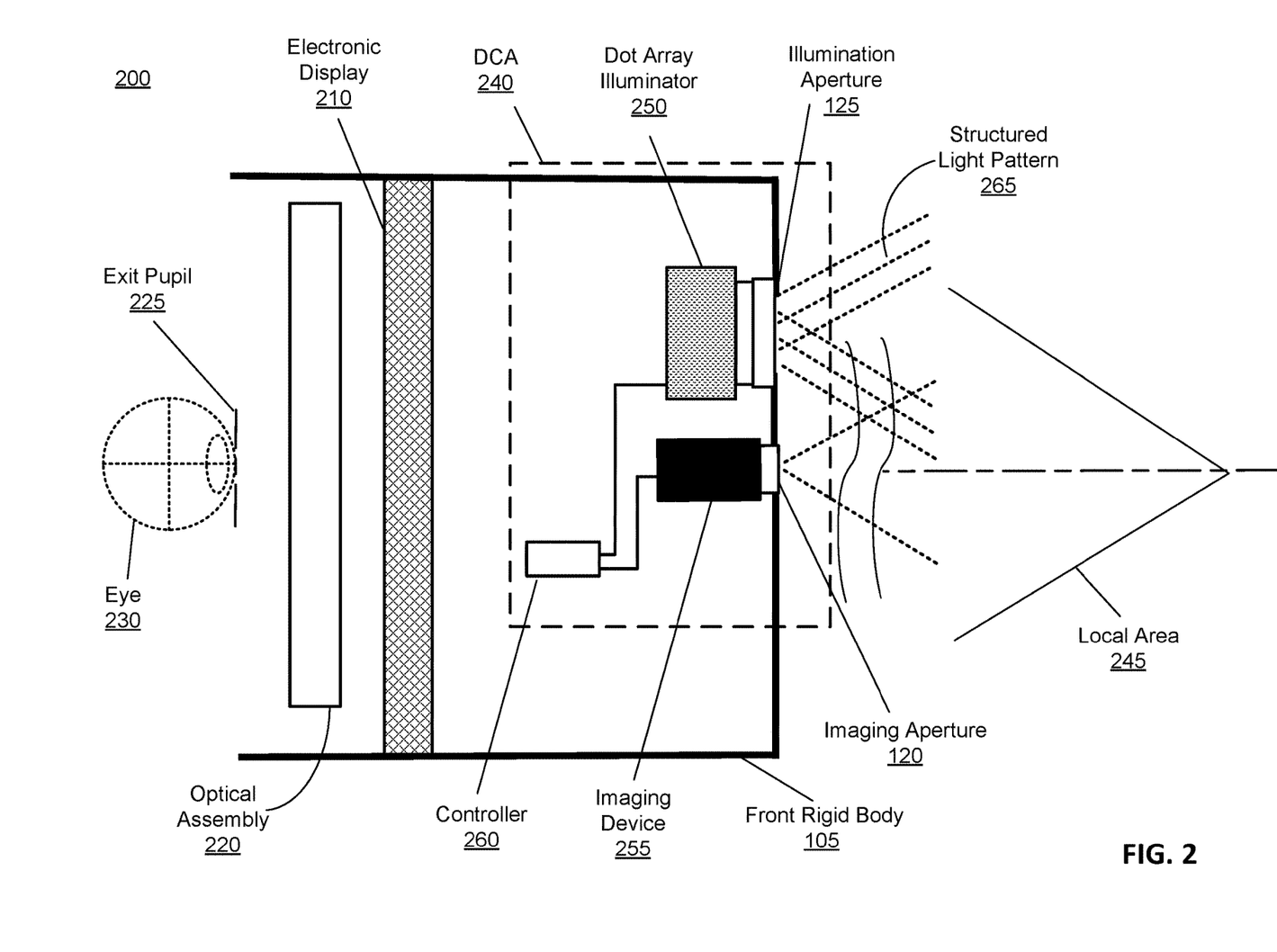
FIG. 2 is a diagram illustrating a cross section of a front rigid body of a headset, according to one embodiment.

FIG. 2 is a diagram illustrating a cross section 200 of the front rigid body 105 of the headset 100 shown in FIG. 1. As shown in FIG. 2, the front rigid body 105 includes an electronic display 210 and an optical assembly 220 that together provide image light to an exit pupil 225. The exit pupil 225 is the location of the front rigid body 105 where a user's eye 230 is positioned. For purposes of illustration, FIG. 2 shows a cross section 200 associated with a single eye 230, but another optical assembly 220, separate from the optical assembly 220, provides altered image light to another eye of the user. The front rigid body 105 also has an optical axis corresponding to a path along which image light propagates through the front rigid body 105.

The electronic display 210 generates image light. In some embodiments, the electronic display 210 includes an optical element that adjusts the focus of the generated image light. The electronic display 210 displays images to the user in accordance with data received from a console (not shown in FIG. 2). The electronic display 210 may include a single electronic display or multiple electronic displays (e.g., a display for each eye of a user). Examples of the electronic display 210 include: a liquid crystal display (LCD), an organic light emitting diode (OLED) display, an inorganic light emitting diode (ILED) display, an active-matrix organic light emitting diode (AMOLED) display, a transparent organic light emitting diode (TOLED) display, some other display, a projector, or some combination thereof. The electronic display 210 may also include an aperture, a Fresnel lens, a convex lens, a concave lens, a diffractive element, a waveguide, a filter, a polarizer, a diffuser, a fiber taper, a reflective surface, a polarizing reflective surface, or any other suitable optical element that affects the image light emitted from the electronic display. In some embodiments, one or more of the display block optical elements may have one or more coatings, such as anti-reflective coatings.

The optical assembly 220 magnifies received light from the electronic display 210, corrects optical aberrations associated with the image light, and the corrected image light is presented to a user of the headset 100. At least one optical element of the optical assembly 220 may be an aperture, a Fresnel lens, a refractive lens, a reflective surface, a diffractive element, a waveguide, a filter, or any other suitable optical element that affects the image light emitted from the electronic display 210. Moreover, the optical assembly 220 may include combinations of different optical elements. In some embodiments, one or more of the optical elements in the optical assembly 220 may have one or more coatings, such as anti-reflective coatings, dichroic coatings, etc. Magnification of the image light by the optical assembly 220 allows elements of the electronic display 210 to be physically smaller, weigh less, and consume less power than larger displays. Additionally, magnification may increase a field-of-view of the displayed media. For example, the field-of-view of the displayed media is such that the displayed media is presented using almost all (e.g., 110 degrees diagonal), and in some cases all, of the user's field-of-view. In some embodiments, the optical assembly 220 is designed so its effective focal length is larger than the spacing to the electronic display 210, which magnifies the image light projected by the electronic display 210. Additionally, in some embodiments, the amount of magnification may be adjusted by adding or removing optical elements.

As shown in FIG. 2, the front rigid body 105 further includes a DCA 240 for determining depth information of one or more objects in a local area 245 surrounding some or all of the headset 100. The DCA 240 includes a dot array illuminator 250, an imaging device 255, and a controller 260 that may be coupled to both the dot array illuminator 250 and the imaging device 255. The dot array illuminator 250 emits structured light through the illumination aperture 125. In various embodiments, the structured light consists of dot patterns. The dot array illuminator 250 may emit the structured light in accordance with emission instructions generated by the controller 260.

The imaging device 255 is a camera that captures, through the imaging aperture 120, portions of the one or more structured light patterns 265 scattered or reflected from the local area 245. The imaging device 255 captures one or more images of one or more objects in the local area 245 illuminated with the one or more structured light patterns 265. Some embodiments of the DCA 200 may include multiple imaging devices 255 configured to enable the controller to perform stereo imaging analysis. The multiple imaging devices may be positioned symmetrically within the DCA or in various alternate orientations.

The controller 260 determines depth information for the one or more objects based on the captured portions of the one or more scattered or reflected polarized structured light patterns. In some embodiments, the controller 260 provides the determined depth information to a console (not shown in FIG. 2) and/or an appropriate module of the headset 100 (e.g., a varifocal module, not shown in FIG. 2). The console and/or the headset 100 may utilize the depth information to, e.g., generate content for presentation on the electronic display 210.

The controller 260 controls operation of certain components of the dot array illuminator 250, for example by generating illumination parameters. The illumination parameter may include, e.g., a source wavelength, pulse rate, pulse amplitude, beam type (continuous or pulsed), a polarization state, other parameter(s) that affect the emitted light, or some combination thereof. In some embodiments, the controller 260 may provide the illumination parameter to a microlens array of the dot array illuminator 250 to control a field-of-view of the local area 245 illuminated by the structured light pattern 265. In various embodiments including multiple imaging devices 255, the controller 260 determines the depth measurement using one or more stereo imaging processes to compare sets of pixels representing a common local region in images captured by multiple imaging sensors 260. The controller 260 may also perform active stereo depth sensing using textures or features illuminated by structured light emitted from a structured light emitter (e.g., the dot array illuminator 250).

The dot array illuminator 250 may include a plurality of light emitting components that each emits light having certain characteristics (e.g., wavelength, polarization, coherence, temporal behavior, etc.). For each source array, each light emitting component of the array is configured to share one or more characteristics, for example wavelength, power, polarization, or a combination thereof. Each light emitting component may also be designed with a low coherence with other light emitting components of the source array (i.e., configured to independently emit structured light while being operated in parallel). The emitters of a given source array can be operated simultaneously. In one embodiment, the plurality of emitters could be, e.g., laser diodes (e.g., edge emitters), inorganic or organic LEDs, a vertical-cavity surface-emitting laser (VCSEL), or some other source. The dot array illuminator 250 may include a plurality of microlens arrays that receive light from emitted from the light emitting components and output the structured light pattern 265. A microlens can be a gradient-index (GRIN) lens, a Fresnel lens, a convex lens, a concave lens or other optical element that refracts light.

In some embodiments, the front rigid body 105 further includes an eye tracking system (not shown in FIG. 2) that determines eye tracking information for the user's eye 230. The determined eye tracking information may include information about an orientation of the user's eye 230 in an eye-box, i.e., information about an angle of an eye-gaze. The eye-box represents a three-dimensional volume at an output of the headset 100 in which the user's eye is located to receive image light. In one embodiment, the eye tracking system includes a dot array illuminator emits a structured light patter to illuminate the user's eye 230. The dot array illuminator may be structurally similar to the dot array illuminator 300 as further described below with reference to FIGS. 3A through 6. Then, the eye tracking system can use locations of the reflected structured light pattern in a captured image to determine eye position and eye-gaze. In another embodiment, the eye tracking system determines eye position and eye-gaze based on magnitudes of image light captured over a plurality of time instants.

In some embodiments, the front rigid body 105 further comprises a varifocal module (not shown in FIG. 2). The varifocal module may adjust focus of one or more images displayed on the electronic display 210, based on the eye tracking information. In one embodiment, the varifocal module adjusts focus of the displayed images and mitigates vergence-accommodation conflict by adjusting a focal distance of the optical assembly 220 based on the determined eye tracking information. In another embodiment, the varifocal module adjusts focus of the displayed images by performing foveated rendering of the one or more images based on the determined eye tracking information. In yet another embodiment, the varifocal module utilizes the depth information from the controller 260 to generate content for presentation on the electronic display 210.

Figure 3A:
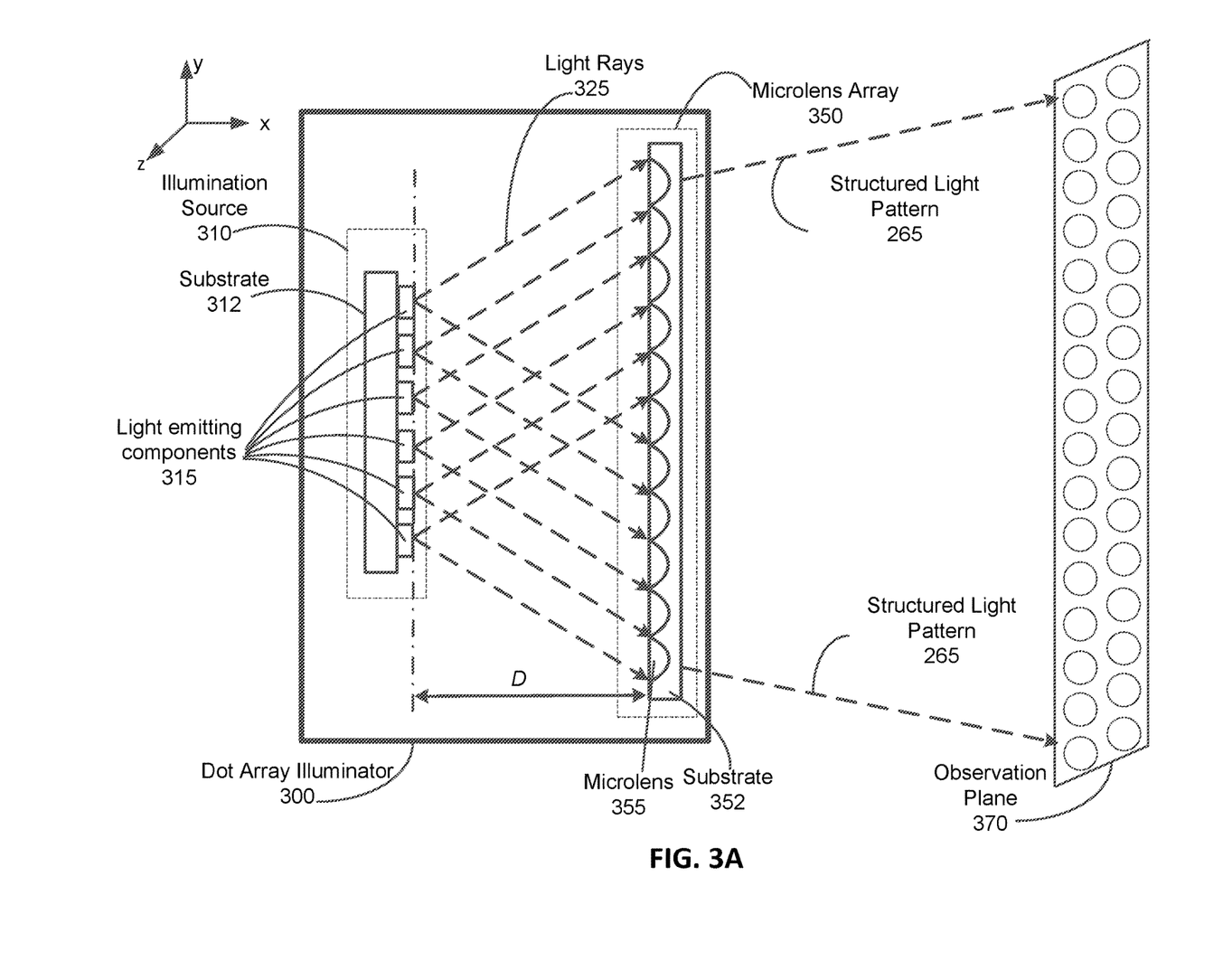
FIG. 3A is a diagram illustrating a cross-section of a dot array illuminator, according to one embodiment.

FIG. 3A is a diagram illustrating a cross-section of a dot array illuminator 300, according to one embodiment. The dot array illuminator 300 is an embodiment of the dot array illuminator 250 illustrated in FIG. 2. The dot array illuminator 300 includes an illumination source 310 and an MLA 350. The illumination source 310 includes a substrate 312 and light emitting components 315 mounted on the substrate 312. The illumination source 310 emits light rays 325 towards the MLA 350. The light emitting components are active components of the illumination source that emit light rays. Each light emitting component is a source of light that generates a spatially coherent or a partially spatially coherent light. The light emitting component may be a light emitting diode (LED), a laser diode, a vertical cavity surface emitting laser (VCSEL), a tunable laser, or some other light source. As described above, light emitting components emits light independently of other components of a source array such that each exhibits no or low spatial and temporal coherence between other components. Accordingly, the two-dimensional array produced by a combination of such light emitting component (i.e., the source array) behaves as a periodic array of incoherent light sources. The light emitting component can emit light in one or more portions of an IR band (e.g., from about 700 nm to 3000 nm), one or more portions of a visible band (e.g., 380-740 nm), or some combination thereof. For example, there may be a light emitting component configured to emit light at 850 nm and a different light emitting component configured to emit light at 830 nm. Portions of the visible band may include red visible light in the optical band of about 625-740 nm, green visible light in the optical band of about 500-565 nm, blue visible light in the optical band of about 450-485 nm, some other portion of the visible band, or some combination thereof. The light emitting component may emit light that is continuous or pulsed. In one embodiment, the illumination source 310 may be fabricated and packaged into one chip. That is, all source arrays of the illumination source 310 are supported by one substrate 312. In other embodiments, the illumination source 310 may include multiple discrete chips that are packaged into one package. Different parts of the illumination source 310 are supported by separate substrates.

The light emitting components 315 are positioned on the substrate 312 in a particular geometric configuration. In one embodiment, the light emitting components 315 are arranged in a square grid (i.e., a configuration with an equal periodicity in the y direction and the z direction). Such an array of light emitting components is also hereinafter referred to as a source array. In the source array, the light emitting components are placed in a regular 2-D grid. In one configuration, the geometric configuration is a square grid. In the square grid, the centers of two neighboring light emitting components are separated by the same distance d (i.e., a pitch). Within a source array, each light emitting component is associated with constant pitch across the entire source array. The source arrays can be controlled to emit light concurrently or separately in terms of the set of arrays. In some configurations in which each source array is driven in parallel, a single source array is characterized by its pitch (e.g., a simple square grid of pitch d). In some configurations, the arrays can be the geometric configuration includes multiple interleaved square grids of the same grid pitch. Each square grid includes light emitting components emitting light in a particular optical band. The multiple square grids are aligned but shifted relative to each other. Source arrays of the multiple square grids can be driven independently to adjust a pattern of the structured light pattern 265. Embodiments involving source arrays that emit light of different wavelengths are further described with reference to FIGS. 4A through 6.

The MLA 350 receives light emitted by the illumination source 310 and outputs the structured light pattern 265. As illustrated, the structured light pattern 265 is a series of dot patterns (arranged in a similar configuration to the source array(s) or MLA) observed at the observation plane 370. The MLA 350 includes a substrate 352 and microlenses 315 formed on the substrate 352. A microlens 315 is an optical element that refracts light. The microlens 315 can be a gradient-index (GRIN) lens, a Fresnel lens, a concave lens or other optical element that refracts light. The microlens 315 has a first aperture for receiving and a second aperture for outputting light. The apertures may have a flat surface or a spherical surface.

The MLA 350 includes arrays of microlenses that are positioned in a geometric configuration. In some configurations, the arrays of microlenses are positioned along the y direction and along the z direction to form a grid. The microlenses interpolate the received light rays 325 thereby to form the structured light pattern 265. The centers of two neighboring microlenses are separated by a distance. Two neighboring microlenses can be adjacent to each other or separated by a gap. In one configuration, the arrays of microlenses are positioned to form the square grid resembling the configuration of that includes equivalent numbers of arrays of microlenses along the y direction and along the z direction the source array. Each array of microlenses along the y direction or along the z direction of the square grid includes the same number of microlenses. In the square grid, the centers of two neighboring microlenses are separated by the same distance (i.e., a pitch). Each lens of the MLA 350 is designed at the same periodicity as the light emitting components 315 of the source array and positioned parallel to the source array at a distance d. In various embodiments, the MLA 350 has a fill-ratio of substantially 100% in order to achieve high-contrast pattern. That is, a ratio of an area of apertures of the microlenses to an area occupied by the microlenses is substantially 100%. For light rays 325 of a particular luminance, the contrast of the structured light pattern 265 increases with the fill-ratio of the MLA. In embodiments in which the dot array illuminator 300 includes multiple source arrays, a single MLA may independently receive light emitted from each array to generate a superposition of the dot array patterns associated with each source array.

The MLA 350 may be switchable and/or tunable. That is, the fill-ratio and/or the optical power of the MLA 350 can be adjusted. In some embodiments, the MLA 350 includes microlenses that can be switched between refracting and nonrefracting states. In some embodiments, the MLA 350 includes at least one microlenses 355 of which the optical power can be adjusted in the refracting state. The microlens may be made of liquid crystals (LCs). The MLA 350 may be switched and/or tuned by adjusting a voltage provided to the MLA 350. Each microlens of the MLA 350 is tuned, switched, or adjusted in the same manner to maintain the periodicity and uniformity of the MLA 350. The uniform adjustments result in changes in the field of view of the dot pattern and in the concentration ratio (i.e., a comparison of the dot size relative to the dot spacing).

Figure 3B:
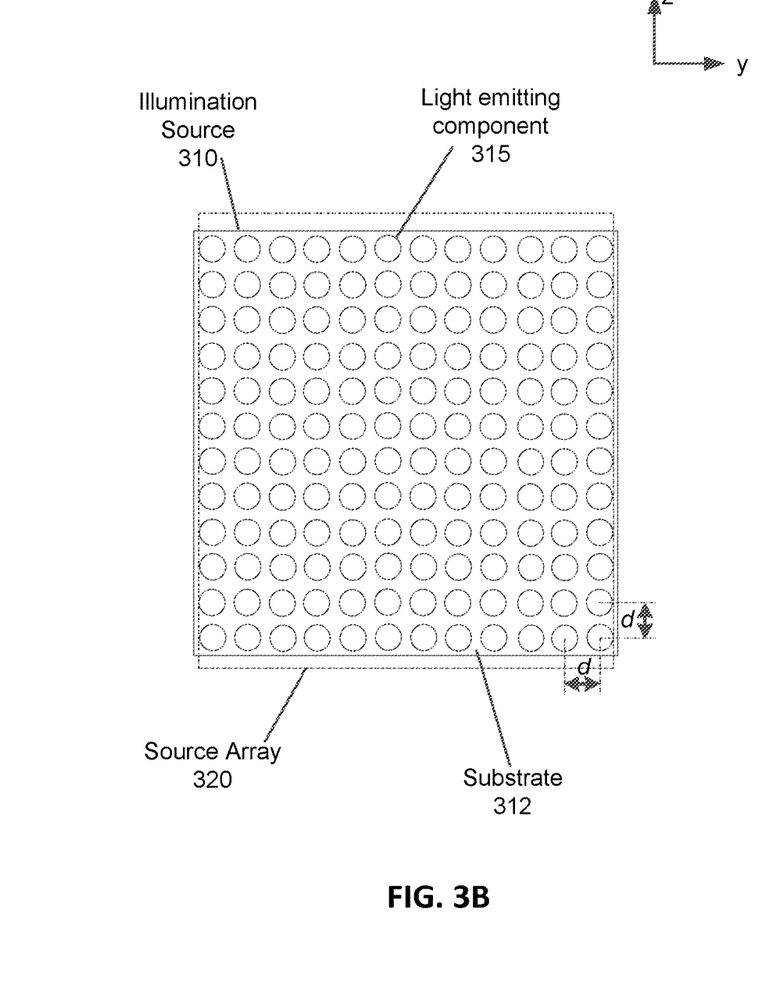
FIG. 3B is a diagram illustrating a top view of an illumination source, according to one embodiment.
Figure 3C:
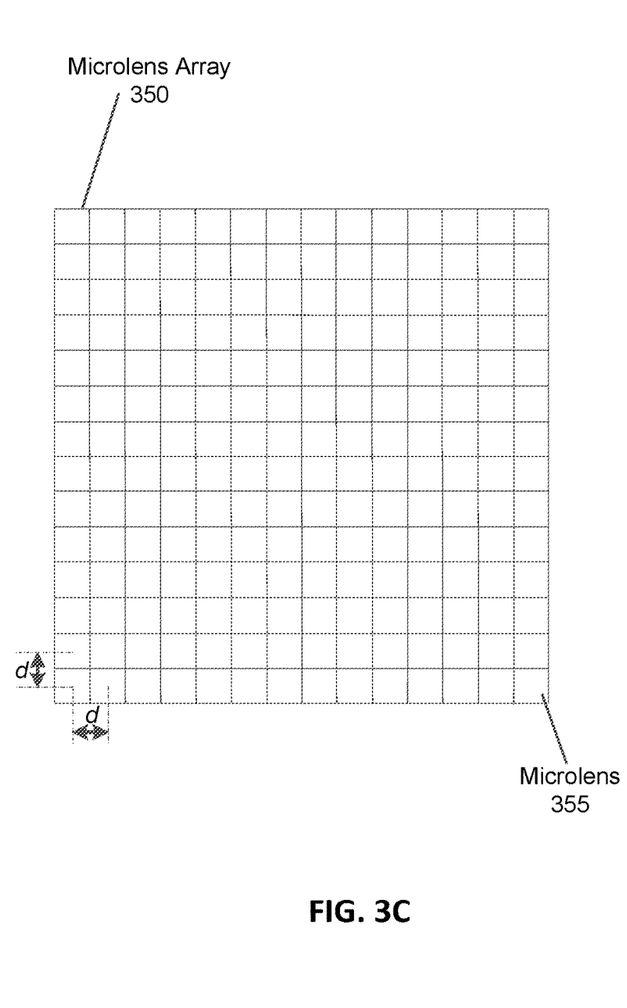
FIG. 3C is a diagram illustrating a top view of a microlens array, according to one embodiment.

In various embodiments, the light emitting components 315 and the microlenses 355 are positioned along the y-z plane similarly. That is, the geometric configuration of light emitting components on the substrate 312 is similar to the geometric configuration of microlenses 355 on the substrate 352. For example, the light emitting components 315 are positioned in a square grid and the microlenses 355 are also positioned in a square grid. Embodiments which deviate from this alignment between the source array and MLA may be associated with a reduced dot array pattern resulting from the superposition of light rays emitted by one or more source arrays. A source array is aligned along either the y direction or the z direction and the centers of two neighboring light emitting components are separated by a distance. Similarly, an array of microlenses is aligned along either the y direction or the z direction and the centers of two neighboring microlenses are separated by the same distance. Referring now to FIGS. 3B and 3C, FIG. 3B is a diagram illustrating a top view of an illumination source and FIG. 3C is a diagram illustrating a top view of a microlens array, according to one embodiment. FIGS. 3B and 3C are discussed in connection with each other. The illumination source 310 includes source arrays including light emitting components 315 that are positioned in a square configuration. A source array is positioned either along the y direction or along the z direction and includes 12 light emitting components. The centers of two neighboring light emitting elements are aligned along the y direction or z direction and are separated by a distance d. The MLA 350 includes microlenses that are also positioned in a square configuration. An array of microlenses is positioned either along the y direction or along the z direction and includes 14 microlenses. The centers of two neighboring microlenses are aligned and are separated by the same distance d. In the illustrated embodiment, the source array 320 includes a single array of light emitting components, multiple arrays of light emitting components can form the source array 320.

Referring now back to FIG. 3A, the illumination source 310 and the MLA 350 overlap with each other along the y-z plane. In various embodiments, a frontal surface of the illumination source 310 is substantially parallel to a rear surface of the MLA 350, both of which are substantially parallel to the y-z plane. The centers of the illumination source 310 and the MLA 350 are aligned along the x direction. The frontal surface of the illumination source 310 and the rear surface of the MLA 350 are separated by a distance D. As such, the MLA 350 may receive substantially all light rays 325 emitted by the illumination source 310. The distance D may be determined according to Equation (1):

$$D=(n)(d^2/\lambda) \qquad (1),$$

where n is an integer, λ denotes the wavelength of the light rays 325, and d denotes the distance between two neighboring light emitting sources. The center of the source 210 and the center of MLA 250 are aligned along the z-direction. If the integer n is equal to one, the angular period θ of the structured light pattern 265 can be determined as λ/d.

In the illustrated example, the density of the structured light pattern 265 is uniform. In some embodiments, the density of the structured light pattern 265 is not uniform with respect to one of the directions (for e.g., the z direction). For example, in a stereo-vision system, the density of the structured light pattern 265 may decrease from the center along the epipolar direction (e.g., the z direction). The epipolar direction may be determined based on the placement of two stereo cameras. To achieve this, the illumination source 310 and MLA 350 may be rotated relative to each other along the y-z plane. At least one of a source array and an array of microlenses is not along the y direction or the z direction. In further embodiments, the light emitting components 315 and the microlenses can be positioned in other geometric shapes such as hexagonal, octagonal, and the like.

Figure 4A:
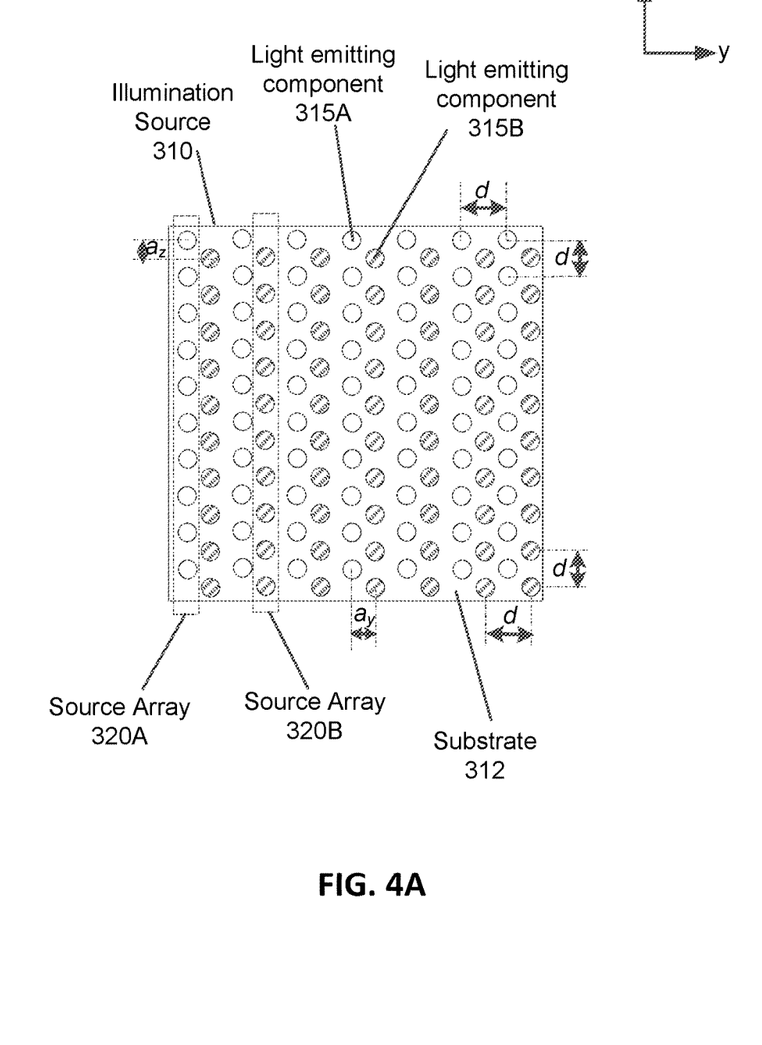
FIG. 4A is a diagram illustrating a top view of an illumination source, according to one embodiment.

FIG. 4A illustrates a top view of an illumination source 310. The illumination source 310 includes two sets of source arrays of the square grid (320A and 320B). Although illustrated in FIG. 4A as a single column of light-emitting components, source array 320A refers to the entire array of light-emitting components represented as white circles arranged in a square configuration and source array 320B refers to the entire array of light-emitting components represented as circles with diagonal cross-hatching arranged in a square configuration. A source array 320A (or 320B) is positioned either along the y direction or along the z direction and includes 10 light emitting components 315A (or 315B). The centers of two neighboring light emitting elements 320A (or 320B) are aligned along the y direction or z direction and are separated by a distance d. These two sets of source arrays (320A and 320B) have the same pitch d, and they are interleaved with each other by a shift of $(a_y, a_z)$. The light emitting components 315A and 315B emit light in the IR band (e.g., from about 700 nm to 3000 nm). As described herein, the parameter $a_y$ or $a_z$ describes the relative displacement between 2D identical grid arrays 320A and 320B and are selected such that the separation between light emitting components is a physically feasible configuration. The light emitting components 315A and 315B may emit light in the same portion of the IR band or different portions of the IR band. The source arrays 320A are arranged in a first square grid and the source arrays 320B are arranged in a second square grid. The first square grid and the second square grid are of the same dimension but are shifted relative to each other. The source arrays 320A and 320B are interleaved. Two neighboring source arrays 320A and 320B are separated by a distance a along the y direction or along the z direction. Light emitted by the source arrays 320A and 320B interacts independently the MLA 350, resulting in a superposition of the corresponding dot array patterns 265. In various embodiments, the source arrays 320A and 320B are VCSEL arrays. In one embodiment as illustrated in FIG. 4A, the light emitting components 315A and 315B emit light at the same wavelength (λ) and both array are designed to have the same pitch d. Additionally, each array source emits light towards MLA to generate a set of high-contrast dot array pattern. In alternate embodiments in which one source array of a pair of source arrays emit light at a significantly different wavelength than the other, at a different pitch than the other, at a different orientation with respect to the MLA than the other, or a combination thereof, only one of the pair of source arrays, for example 315A, meets the requirement for generating the high contrast dot array pattern described with reference to Equation (1). The other source array, for example 315, interacts with the MLA to generate a low-contrast dot pattern, for example a flood light.

Each source array 320A or 320B may be configured with a different polarization state such as a linear polarization of different orientations. Diversity in the polarization of the light generated by the illumination source 310 enables the illumination source 310 to perform polarization imaging. In one embodiment, each source array 320A or 320B may be configured with a different linear polarization by modifying each cavity of the source array or output aperture to reflect an elliptical shape. In an alternate embodiment, each source array 320A or 320B may be configured using a polarization filter, for example a monolithic or non-monolithic filter, on the source output aperture. In embodiments in which source arrays are configured with more complex polarization states, the source arrays may be configured using different polarization filters. Dot array illuminators configured with different polarization states may be implemented to perform 3D sensing by providing information such as a material dependent bidirectional reflectance distribution function (BRDF).

Figure 4B:
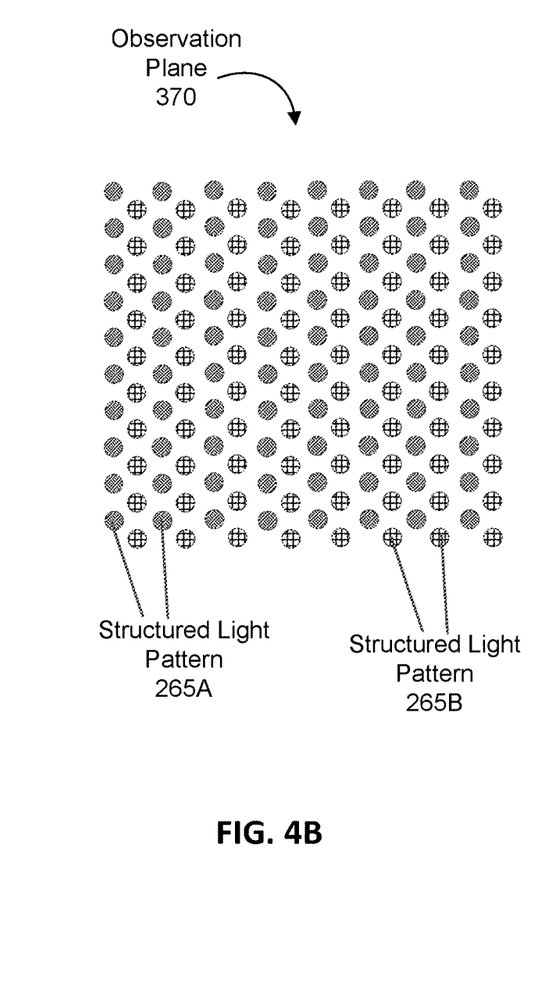
FIG. 4B is a diagram illustrating structured light observed at an observation plane, according to one embodiment.

FIG. 4B is a diagram illuminating the structured light pattern as observed on the observation plane. As illustrated, the pattern is a dot array pattern that includes two types of dotted light that are interleaved. Light emitted by the source arrays 320A form the structured light pattern 265A and light emitted by the source arrays 320B form the structured light pattern 265B. At a given time, if only the source arrays 320A (or 320B) are emitting light, only the structured light pattern 265A (265B) is observed at the observation plane 370. In one embodiment, the source arrays 310 and 320 are VCSEL arrays. In the illustrated example, the illumination source 310 includes two types of source arrays interleaved with each other, the illumination source 310 can include three or more types of source arrays can be interleaved with each other.

Figure 5A:
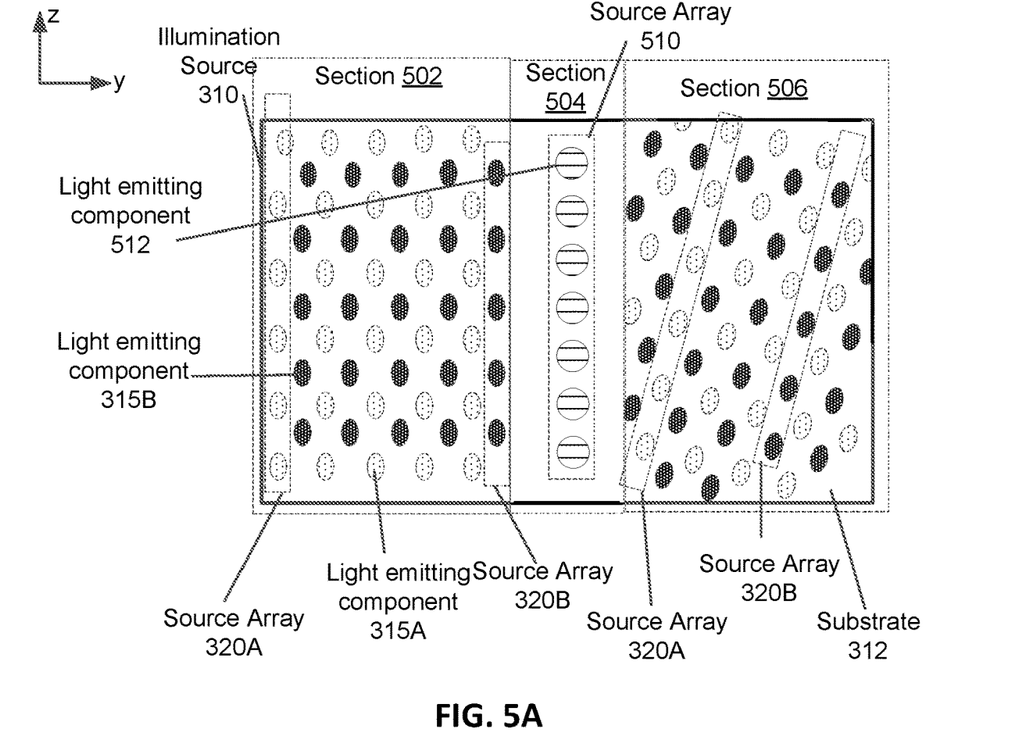
FIG. 5A is a diagram illustrating a top view of an illumination source, according to one embodiment.
Figure 5B:
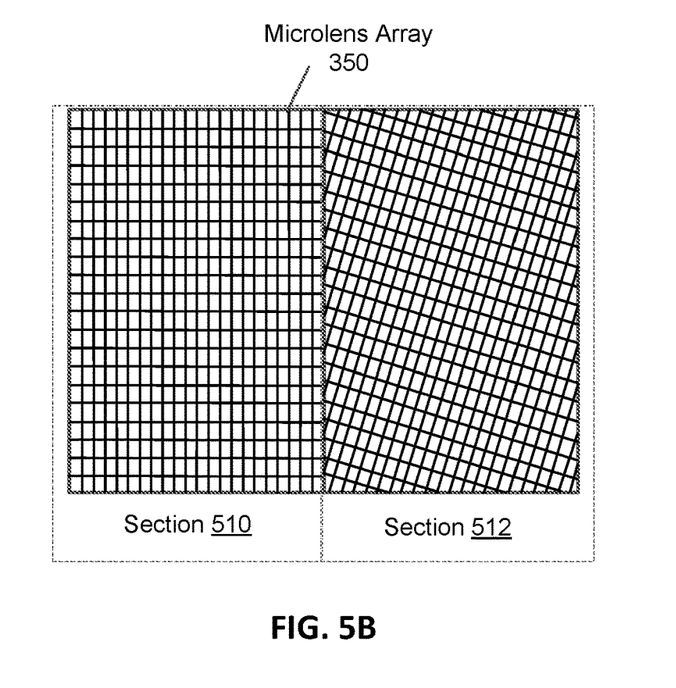
FIG. 5B is a diagram illustrating a top view of a microlens array, according to one embodiment.

In further embodiments, the illumination source 310 may emit flood light. Referring now to FIG. 5A that is a diagram illustrating a top view of an illumination source. The illumination source 310 includes three sections 502, 504, 506. The sections 502 and 506 each include source arrays 320A and 320B. The configuration of source arrays 320A and 320B in sections 502 and 506 are similar to the configuration described in connection with FIG. 4A and is omitted herein. The source arrays 320A and 320B in section 502 are tilted with respect to the source arrays 320A and 320B in section 506 over an epipolar axis. The MILA 350 also includes multiple sections that correspond to different sections of the illumination source 310. One example is illustrated in FIG. 5B. FIG. 5B is a diagram illustrating a top view of an MLA 350. The MLA 350 includes sections 510 and 512 that receive light emitted from sections 502 and 506, respectively. The structured light pattern outputted by the section 512 is rotated relative to the structured light pattern outputted by the section 510 along the epipolar axis. The structured light pattern is a superstition of the light pattern generated by the sections 510 and 512 in response to receiving the light emitted by the sections 502 and 506, respectively.

The gap section 504 separates the sections 502 and 506. The gap section 504 may reduce or substantially minimize the cross-talk between the structured light pattern 265 generated by the sections 502 and 506. That is, the gap section 504 prevents light generated by the section 502 from interacting with light generated by the section 504. The cross-talk may reduce the efficiency in use of the light power and reduces pattern contrast. The dimension of the gap section 504 can be configured based on one or more of the following: a size of the source array 320A, a size of the source array 320B, a pitch, an emitter beam divergence of a light emitting component 315A, an emitter beam divergence of a light emitting component 315B, and the distance D between the illumination source 310 and the MLA 350.

As illustrated, the section 504 includes a source array 510 including light emitting components 512. The source array 510 emits flashlight. The MLA 350 receives the flash light and outputs a uniform flood (i.e., a low contrast pattern projection). The configuration of the source array 510 in the section 504 can differ from the configuration of the source arrays 320A and 320B in the section 502 or 506. For example, the source array 510 can be a random array, positioned in a different geometric grid, have a different pitch, or combination of. The light emitting component 512 may emit light in a different optical band from that of the light emitting components 315A, 315B. The light emitting components in the sections 502, 506, and 504 can be controlled to emit light concurrently or independently.

Figure 6:
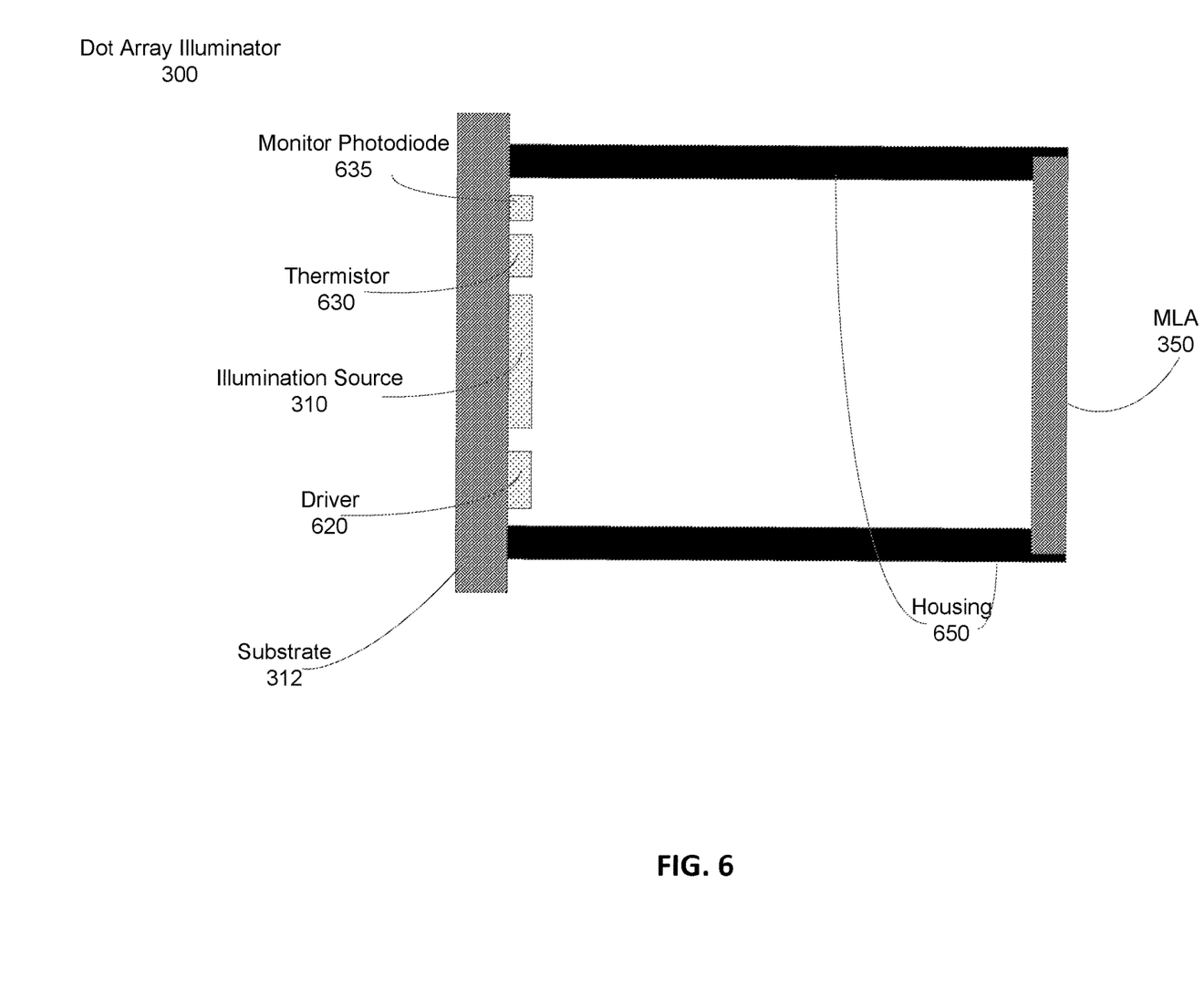
FIG. 6 is a diagram illustrating a cross-section of a dot array illuminator, according to one embodiment.

In some configurations, the dot array illuminator 310 monitors its operation. One example is illustrated in FIG. 6. FIG. 6 is a diagram illustrating a cross-section view of a dot array illuminator, according to one embodiment. The dot array illuminator 300 includes the illuminator source 310, the MLA 350, a thermistor 630, a monitor photodiode 635, a driver 620, and the substrate 312. The illuminator 310, the thermistor 630, the monitor photodiode 635, and the driver 620 are supported by the substrate 312 and are enclosed by the housing 650. The housing prevents light beams emitted from the illumination source 310 from leaking. The photodiode 535 detects photons in the housing 650. As such, the dot array illuminator 300 detects light reflection off of the MLA 370 and housing 550. If the photodiode 535 detects photons making incidental contact to it, it outputs a current signal. The controller 260 generates an instruction based on the signal to deactivate the driver 620 from driving the illumination source 310 to emit light. As such, any change of the reflectivity of the MLA 570 above a threshold level of change can be detected. Such change of reflectivity of the MLA 570 may be caused by removal, damage, tampering, or other effects that impact the reflectivity of the MLA 570 such as water formed on the surface of the MLA 570, large scratches, other contaminations, or wear and tear. In some embodiments, the thermistor 630 detects a temperature within the housing 650. If the temperature exceeds a threshold, the controller 260 generates an instruction to deactivate the driver 620 from driving the illumination source 310 to emit light.

The dot array illuminator 300 may dynamically adjust the structured light pattern 265. For example, by turning on the individual set of source arrays, one can generate the corresponding set of dot pattern. The pattern of the structured light pattern 265 can be dynamically adjusted according to a scene. The controller of the depth camera assembly, for example the controller 260 of the DCA 240, may implement a depth sensing algorithm to perform stereovision techniques. Accordingly, the dot array illuminator may project a dot array pattern to apply texture to a surface. For example, the controller may apply a higher density projection to improve the performance of a stereo algorithm on a surface or environment with a low nature texture. Alternatively, the controller may apply a lower density projection pattern to improve the performance of a stereo algorithm on a surface or environment with a high nature texture. The latter embodiment may also result in reduced illuminator power.

In one embodiment, wavelength multiplexing is used to generate a dynamic projection pattern, for example pattern density or arrangement, and individual arrays of light emitting components of one wavelength can be selectively turned on based on the performance of the generated pattern. In embodiments in which a first set of source arrays are configured at a first wavelength and a second set of source arrays are configured at a second wavelength, the two sets of source arrays may be configured to be monolithic on one substrate or to be non-monolithic on separate substrates. In in implementations involving wavelength multiplexing, the distance between a specific array and a corresponding MLA is determined using Equation (1) for each source array.

In some implementations, the illumination source 310 includes more than one set of source arrays that can be controlled independently to emit light separately. Because the input light to the MLA 350 can be adjusted, a pattern of the structured light pattern 265 is adjusted. Dynamically adjusting the structured light projection can more accurately determine depth information as well as reduce power consumption.

System Environment

Figure 7:
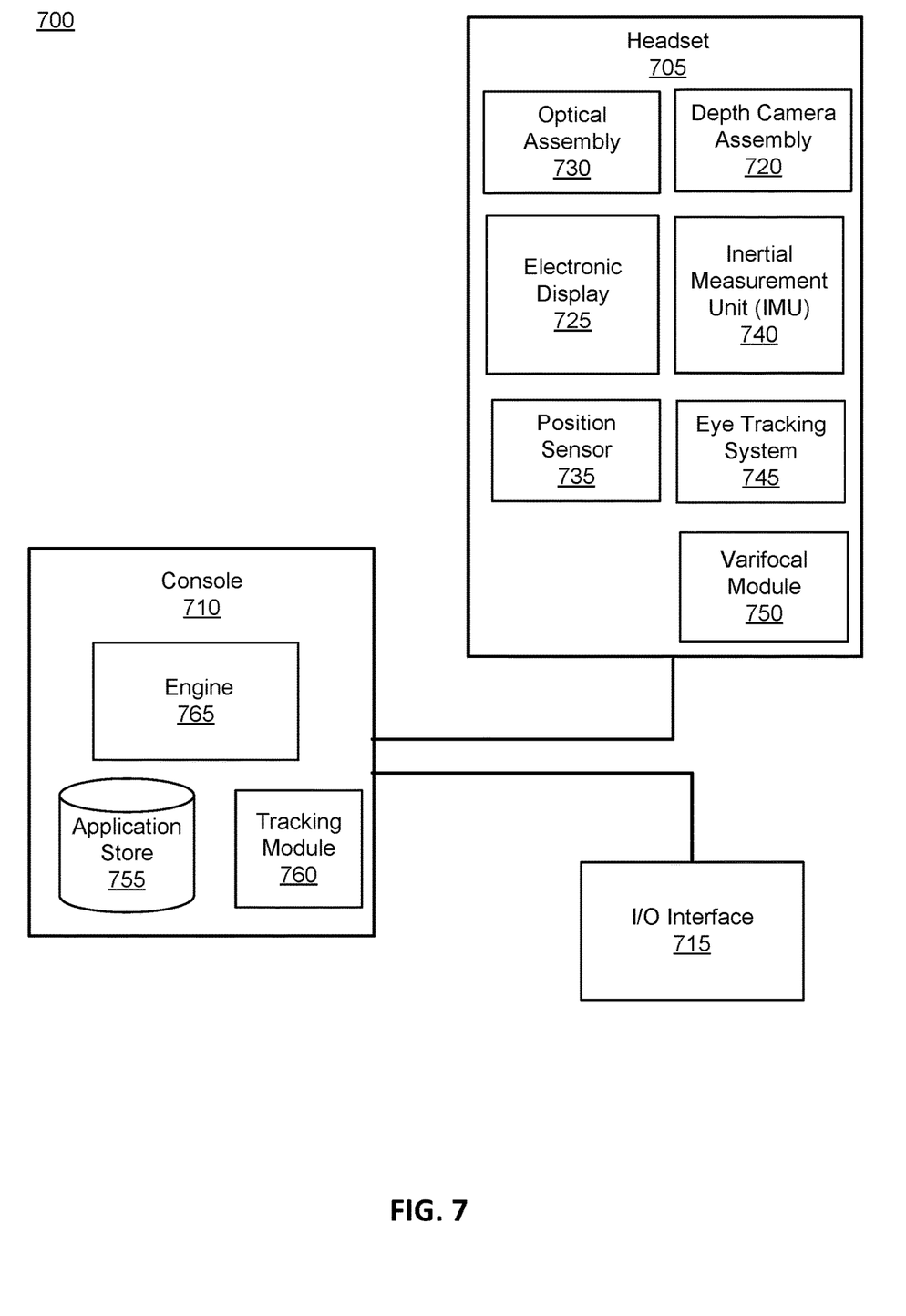
FIG. 7 is a block diagram of a headset system in which a console operates, according to one embodiment.

FIG. 7 is a block diagram of one embodiment of a headset system 700 in which a console 710 operates. The headset system 700 may operate in a VR system environment, an AR system environment, a MR system environment, or some combination thereof. The headset system 700 shown by FIG. 7 comprises a headset 705 and an input/output (I/O) interface 715 that is coupled to the console 710. While FIG. 7 shows an example headset 700 including one headset 705 and on I/O interface 715, in other embodiments any number of these components may be included in the headset 700. For example, there may be multiple headsets 705 each having an associated I/O interface 715, with each headset 705 and I/O interface 715 communicating with the console 710. In alternative configurations, different and/or additional components may be included in the headset 700. Additionally, functionality described in conjunction with one or more of the components shown in FIG. 7 may be distributed among the components in a different manner than described in conjunction with FIG. 7 in some embodiments. For example, some or all of the functionality of the console 710 is provided by the headset 705.

The headset 705 is a head-mounted display that presents content to a user comprising virtual and/or augmented views of a physical, real-world environment with computer-generated elements (e.g., two-dimensional (2D) or three-dimensional (3D) images, 2D or 3D video, sound, etc.). In some embodiments, the presented content includes audio that is presented via an external device (e.g., speakers and/or headphones) that receives audio information from the headset 705, the console 710, or both, and presents audio data based on the audio information. The headset 705 may comprise one or more rigid bodies, which may be rigidly or non-rigidly coupled together. A rigid coupling between rigid bodies causes the coupled rigid bodies to act as a single rigid entity. In contrast, a non-rigid coupling between rigid bodies allows the rigid bodies to move relative to each other. An embodiment of the headset 705 is the headset 100 described above in conjunction with FIG. 1.

The headset 705 includes a depth camera assembly 720, an electronic display 725, an optical assembly 730, one or more position sensors 735, an IMU 740, an eye tracking system 745, and a varifocal module 750. Some embodiments of the headset 705 have different components than those described in conjunction with FIG. 7. Additionally, the functionality provided by various components described in conjunction with FIG. 7 may be differently distributed among the components of the headset 705 in other embodiments.

The depth camera assembly 720 includes a projector and an imaging device that captures data describing depth information of an area surrounding some or all of the headset 705. The depth camera assembly 720 can compute the depth information using the data (e.g., based on captured portions of one or more scattered structured light patterns), or the depth camera assembly 720 can send this information to another device such as the console 710 that can determine the depth information using the data from the depth camera assembly 720.

In some embodiments, the depth camera assembly 720 includes a dot array illuminator that projects structured light patterns (e.g., dot patterns). The dot array includes an illumination source that includes one or more source arrays and a microlens array (MLA). A source array is an array of light emitting components. The source arrays are positioned on a substrate according to a geometric configuration. The MLA includes lens arrays that are arranged in a similar geometric configuration. The microlens array are separated from the source arrays by a distance and are substantially parallel to the source arrays. The microlens array overlaps with the source array and is of a dimension such that it can receive substantially all light emitted by the illumination source. The illumination source emits light towards the MLA. The MLA receives the light and outputs structured pattern light by interpolating received light.

The electronic display 725 displays 2D or 3D images to the user in accordance with data received from the console 710. In various embodiments, the electronic display 725 comprises a single electronic display or multiple electronic displays (e.g., a display for each eye of a user). Examples of the electronic display 725 include: a liquid crystal display (LCD), an organic light emitting diode (OLED) display, an inorganic light emitting diode (ILED) display, an active-matrix organic light emitting diode (AMOLED) display, a transparent organic light emitting diode (TOLED) display, some other display, or some combination thereof.

The optical assembly 730 magnifies image light received from the electronic display 725, corrects optical errors associated with the image light, and presents the corrected image light to a user of the headset 705. The optical assembly 730 includes a plurality of optical elements. Example optical elements included in the optical assembly 730 include: an aperture, a Fresnel lens, a convex lens, a concave lens, a filter, a reflecting surface, or any other suitable optical element that affects image light. Moreover, the optical assembly 730 may include combinations of different optical elements. In some embodiments, one or more of the optical elements in the optical assembly 730 may have one or more coatings, such as partially reflective or anti-reflective coatings.

Magnification and focusing of the image light by the optical assembly 730 allows the electronic display 725 to be physically smaller, weigh less and consume less power than larger displays. Additionally, magnification may increase the field of view of the content presented by the electronic display 725. For example, the field of view of the displayed content is such that the displayed content is presented using almost all (e.g., approximately 110 degrees diagonal), and in some cases all, of the user's field of view. Additionally, in some embodiments, the amount of magnification may be adjusted by adding or removing optical elements.

In some embodiments, the optical assembly 730 may be designed to correct one or more types of optical error.

Examples of optical error include barrel or pincushion distortions, longitudinal chromatic aberrations, or transverse chromatic aberrations. Other types of optical errors may further include spherical aberrations, chromatic aberrations or errors due to the lens field curvature, astigmatisms, or any other type of optical error. In some embodiments, content provided to the electronic display 725 for display is predistorted, and the optical assembly 730 corrects the distortion when it receives image light from the electronic display 725 generated based on the content.

The IMU 740 is an electronic device that generates data indicating a position of the headset 705 based on measurement signals received from one or more of the position sensors 735 and from depth information received from the depth camera assembly 720. A position sensor 735 generates one or more measurement signals in response to motion of the headset 705. Examples of position sensors 735 include: one or more accelerometers, one or more gyroscopes, one or more magnetometers, another suitable type of sensor that detects motion, a type of sensor used for error correction of the IMU 740, or some combination thereof. The position sensors 735 may be located external to the IMU 740, internal to the IMU 740, or some combination thereof.

Based on the one or more measurement signals from one or more position sensors 735, the IMU 740 generates data indicating an estimated current position of the headset 705 relative to an initial position of the headset 705. For example, the position sensors 735 include multiple accelerometers to measure translational motion (forward/back, up/down, left/right) and multiple gyroscopes to measure rotational motion (e.g., pitch, yaw, roll). In some embodiments, the IMU 740 rapidly samples the measurement signals and calculates the estimated current position of the headset 705 from the sampled data. For example, the IMU 740 integrates the measurement signals received from the accelerometers over time to estimate a velocity vector and integrates the velocity vector over time to determine an estimated current position of a reference point on the headset 705. Alternatively, the IMU 740 provides the sampled measurement signals to the console 710, which interprets the data to reduce error. The reference point is a point that may be used to describe the position of the headset 705. The reference point may generally be defined as a point in space or a position related to the orientation and position of the headset 705.

The IMU 740 receives one or more parameters from the console 710. The one or more parameters are used to maintain tracking of the headset 705. Based on a received parameter, the IMU 740 may adjust one or more IMU parameters (e.g., sample rate). In some embodiments, certain parameters cause the IMU 740 to update an initial position of the reference point so it corresponds to a next position of the reference point. Updating the initial position of the reference point as the next calibrated position of the reference point helps reduce accumulated error associated with the current position estimated the IMU 740. The accumulated error, also referred to as drift error, causes the estimated position of the reference point to "drift" away from the actual position of the reference point over time. In some embodiments of the headset 705, the IMU 740 may be a dedicated hardware component. In other embodiments, the IMU 740 may be a software component implemented in one or more processors.

In some embodiments, the eye tracking system 745 is integrated into the headset 705. The eye tracking system 745 determines eye tracking information associated with an eye of a user wearing the headset 705. The eye tracking information determined by the eye tracking system 745 may comprise information about an orientation of the user's eye, i.e., information about an angle of an eye-gaze. In some embodiments, the eye tracking system 745 is integrated into the optical assembly 730. An embodiment of the eye tracking system 745 may comprise an illumination source such as a dot array illuminator as described herein and an imaging device (camera).

In some embodiments, the varifocal module 750 is further integrated into the headset 705. The varifocal module 750 may be coupled to the eye tracking system 745 to obtain eye tracking information determined by the eye tracking system 745. The varifocal module 750 may be configured to adjust focus of one or more images displayed on the electronic display 725, based on the determined eye tracking information obtained from the eye tracking system 745. In this way, the varifocal module 750 can mitigate vergence-accommodation conflict in relation to image light. The varifocal module 750 can be interfaced (e.g., either mechanically or electrically) with at least one of the electronic display 725 and at least one optical element of the optical assembly 730. Then, the varifocal module 750 may be configured to adjust focus of the one or more images displayed on the electronic display 725 by adjusting position of at least one of the electronic display 725 and the at least one optical element of the optical assembly 730, based on the determined eye tracking information obtained from the eye tracking system 745. By adjusting the position, the varifocal module 750 varies focus of image light output from the electronic display 725 towards the user's eye. The varifocal module 750 may be also configured to adjust resolution of the images displayed on the electronic display 725 by performing foveated rendering of the displayed images, based at least in part on the determined eye tracking information obtained from the eye tracking system 745. In this case, the varifocal module 750 provides appropriate image signals to the electronic display 725. The varifocal module 750 provides image signals with a maximum pixel density for the electronic display 725 only in a foveal region of the user's eye-gaze, while providing image signals with lower pixel densities in other regions of the electronic display 725. In one embodiment, the varifocal module 750 may utilize the depth information obtained by the depth camera assembly 720 to, e.g., generate content for presentation on the electronic display 725.

The I/O interface 715 is a device that allows a user to send action requests and receive responses from the console 710. An action request is a request to perform a particular action. For example, an action request may be an instruction to start or end capture of image or video data or an instruction to perform a particular action within an application. The I/O interface 715 may include one or more input devices. Example input devices include: a keyboard, a mouse, a game controller, or any other suitable device for receiving action requests and communicating the action requests to the console 710. An action request received by the I/O interface 715 is communicated to the console 710, which performs an action corresponding to the action request. In some embodiments, the I/O interface 715 includes an IMU 740 that captures calibration data indicating an estimated position of the I/O interface 715 relative to an initial position of the I/O interface 715. In some embodiments, the I/O interface 715 may provide haptic feedback to the user in accordance with instructions received from the console 710. For example, haptic feedback is provided when an action request is received, or the console 710 communicates instructions to the I/O interface 715 causing the I/O interface 715 to generate haptic feedback when the console 710 performs an action.

The console 710 provides content to the headset 705 for processing in accordance with information received from one or more of: the depth camera assembly 720, the headset 705, and the I/O interface 715. In the example shown in FIG. 7, the console 710 includes an application store 755, a tracking module 760, and an engine 765. Some embodiments of the console 710 have different modules or components than those described in conjunction with FIG. 7. Similarly, the functions further described below may be distributed among components of the console 710 in a different manner than described in conjunction with FIG. 7.

The application store 755 stores one or more applications for execution by the console 710. An application is a group of instructions, that when executed by a processor, generates content for presentation to the user. Content generated by an application may be in response to inputs received from the user via movement of the headset 705 or the I/O interface 715. Examples of applications include: gaming applications, conferencing applications, video playback applications, or other suitable applications.

The tracking module 760 calibrates the headset system 700 using one or more calibration parameters and may adjust one or more calibration parameters to reduce error in determination of the position of the headset 705 or of the I/O interface 715. For example, the tracking module 760 communicates a calibration parameter to the depth camera assembly 720 to adjust the focus of the depth camera assembly 720 to more accurately determine positions of structured light elements captured by the depth camera assembly 720. Calibration performed by the tracking module 760 also accounts for information received from the IMU 740 in the headset 705 and/or an IMU 740 included in the I/O interface 715. Additionally, if tracking of the headset 705 is lost (e.g., the depth camera assembly 720 loses line of sight of at least a threshold number of structured light elements), the tracking module 760 may re-calibrate some or all of the headset system 700.

The tracking module 760 tracks movements of the headset 705 or of the I/O interface 715 using information from the depth camera assembly 720, the one or more position sensors 735, the IMU 740 or some combination thereof. For example, the tracking module 750 determines a position of a reference point of the headset 705 in a mapping of a local area based on information from the headset 705. The tracking module 760 may also determine positions of the reference point of the headset 705 or a reference point of the I/O interface 715 using data indicating a position of the headset 705 from the IMU 740 or using data indicating a position of the I/O interface 715 from an IMU 740 included in the I/O interface 715, respectively. Additionally, in some embodiments, the tracking module 760 may use portions of data indicating a position or the headset 705 from the IMU 740 as well as representations of the local area from the depth camera assembly 720 to predict a future location of the headset 705. The tracking module 760 provides the estimated or predicted future position of the headset 705 or the I/O interface 715 to the engine 765.

The engine 765 generates a 3D mapping of the area surrounding some or all of the headset 705 (i.e., the "local area") based on information received from the headset 705. In some embodiments, the engine 765 determines depth information for the 3D mapping of the local area based on information received from the depth camera assembly 720 that is relevant for techniques used in computing depth. The engine 765 may calculate depth information using one or more techniques in computing depth from one or more polarized structured light patterns. In various embodiments, the engine 765 uses the depth information to, e.g., update a model of the local area, and generate content based in part on the updated model.

The engine 765 also executes applications within the headset system 700 and receives position information, acceleration information, velocity information, predicted future positions, or some combination thereof, of the headset 705 from the tracking module 760. Based on the received information, the engine 765 determines content to provide to the headset 705 for presentation to the user. For example, if the received information indicates that the user has looked to the left, the engine 765 generates content for the headset 705 that mirrors the user's movement in a virtual environment or in an environment augmenting the local area with additional content. Additionally, the engine 765 performs an action within an application executing on the console 710 in response to an action request received from the I/O interface 715 and provides feedback to the user that the action was performed. The provided feedback may be visual or audible feedback via the headset 705 or haptic feedback via the I/O interface 715.

In some embodiments, based on the eye tracking information (e.g., orientation of the user's eye) received from the eye tracking system 745, the engine 765 determines resolution of the content provided to the headset 705 for presentation to the user on the electronic display 725. The engine 765 provides the content to the headset 705 having a maximum pixel resolution on the electronic display 725 in a foveal region of the user's gaze, whereas the engine 765 provides a lower pixel resolution in other regions of the electronic display 725, thus achieving less power consumption at the headset 705 and saving computing cycles of the console 710 without compromising a visual experience of the user. In some embodiments, the engine 765 can further use the eye tracking information to adjust where objects are displayed on the electronic display 725 to prevent vergence-accommodation conflict.

Additional Configuration Information

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A light projector device comprising:
    an illumination source configured to emit light in an infrared (IR) band, the illumination source comprising a source array positioned on a substrate;
    a microlens array (MLA) configured to receive the emitted light from the illumination source, and to output a first structured light having a pattern in the IR band based on the received light;
    a photodiode positioned directly on the substrate, wherein the photodiode is configured to detect a change in reflectivity of the MLA; and
    a controller configured to cause the MLA to modify the pattern of the first structured light in response to a change in reflectivity of the MLA detected by the photodiode.

2. The light projector device of claim 1, wherein the source array comprises a vertical-cavity surface emitting laser (VCSEL) array and the first structured light is a first dot pattern.

3. The light projector device of claim 2, wherein the controller is configured to generate instructions to adjust a first density of the first dot pattern, the instructions including switching instructions to trigger a first subset of the source array and a second subset of the source array to emit light separately.

4. The light projector device of claim 1, wherein modifying the light comprises deactivating the illumination source.

5. The light projector device of claim 1, wherein the illumination source comprises a second source array positioned on the substrate, wherein the MLA is configured to output a second structured light based on light emitted by the second source array.

6. The light projector device of claim 5, wherein the first structured light and the second structured light are a first dot pattern interleaved with a second dot pattern.

7. The light projector device of claim 1, further comprising a thermistor positioned on the substrate, wherein the controller is configured to modify the light emitted by the illumination source in response to a change in temperature detected by the thermistor.

8. The light projector device of claim 7, wherein the modifying the light comprises deactivating the illumination source in response to the change in temperature exceeding a threshold.

9. The light projector device of claim 1, wherein the illumination source comprises a plurality of source arrays including the source array positioned on the substrate in a first geometric configuration, each source array including first light emitting components, centers of two neighboring first light emitting components separated by a pitch.

10. The light projector device of claim 9, wherein the MLA comprises a plurality of arrays of microlenses configured to receive the emitted light from the illumination source, the plurality of arrays of microlenses positioned in at least one geometric configuration, centers of two neighboring microlenses separated by the pitch.

11. The light projector device of claim 1, further comprising a housing enclosing the illumination source, the photodiode and at least a portion of the MLA, the photodiode configured to detect light in the housing, wherein the illumination source is configured to be switched off in response to a luminance in the housing that is above a threshold level of difference from a luminance under normal operation.

12. A head-mounted display (HMD) comprising:
    a light projector device configured to project structured light in an infrared (IR) band towards an object in a target area, the light projector device comprising:
        an illumination source configured to emit light in the IR band, the illumination source comprising a source array positioned on a substrate;
        a microlens array (MLA) configured to receive the emitted light from the illumination source, and to output a first structured light having a pattern based on the received light;
        a photodiode positioned directly on the substrate, wherein the photodiode is configured to detect a change in reflectivity of the MLA; and
        a controller configured to cause the MLA to modify the pattern of the first structured light in response to a change in reflectivity of the MLA detected by the photodiode; and
    an imaging device configured to receive reflected light, the reflected light being the structured light reflected off the object in a local area.

13. The HMD of claim 12, wherein the target area is a local area surrounding the head-mounted display, wherein the controller is configured to determine a distance of the object from the HMD based on the reflected light.

14. The HMD of claim 12, wherein the object is an eye of a user and the target area is an eye box surrounding the eye of the user, further comprising a controller to determine a position and a movement of the eye based on the reflected light and to provide image content based on the position and the movement of the eye.

15. The HMD of claim 12, wherein the imaging device comprises a pair of stereo depth sensors disposed about a center axis of the HMD.

16. The HMD of claim 15, wherein the illumination source and the MLA are disposed between the pair of stereo depth sensors.

17. A method comprising:
   emitting light in an infrared (IR) band by an illumination source, the illumination source comprising a source array positioned on a substrate;
   receiving, by a microlens array (MLA), the emitted light from the illumination source;
   outputting, by the MLA, a first structured light having a pattern in the IR band based on the received light;
   detecting, by a photodiode positioned directly on the substrate, a change in reflectivity of the MLA; and
   causing, by a controller, the MLA to modify the pattern of the first structured light in response to a change in reflectivity of the MLA detected by the photodiode.

18. The method of claim 17, wherein modifying the light comprises deactivating the illumination source.

19. The method of claim 17, further comprising modifying, by the controller, the light emitted by the illumination source in response to a change in temperature detected by a thermistor positioned on the substrate.

20. The method of claim 19, wherein the modifying the light comprises deactivating the illumination source in response to the change in temperature exceeding a threshold.

* * * * *